United States Patent
Sun et al.

(10) Patent No.: US 10,262,178 B2
(45) Date of Patent: Apr. 16, 2019

(54) ULTRASONIC FINGERPRINT SENSOR PACKAGE

(71) Applicant: NANCHANG O-FILM BIO-IDENTIFICATION TECHNOLOGY CO., LTD., Nanchang (CN)

(72) Inventors: Wensi Sun, Nanchang (CN); Anpeng Bai, Nanchang (CN)

(73) Assignee: NANCHANG O-FILM BIO-IDENTIFICATION TECHNOLOGY CO., LTD, Nanchang (CN)

(*) Notice: Subject to any disclaimer, the term of this patent is extended or adjusted under 35 U.S.C. 154(b) by 46 days.

(21) Appl. No.: 15/489,873

(22) Filed: Apr. 18, 2017

(65) Prior Publication Data
US 2018/0068150 A1 Mar. 8, 2018

(30) Foreign Application Priority Data

Sep. 5, 2016 (CN) .......................... 2016 1 0801757
Sep. 5, 2016 (CN) ...................... 2016 2 1037945 U

(51) Int. Cl.
*G06K 9/28* (2006.01)
*G06K 9/00* (2006.01)
(Continued)

(52) U.S. Cl.
CPC .......... *G06K 9/0002* (2013.01); *H01L 41/042* (2013.01); *H01L 41/0475* (2013.01);
(Continued)

(58) Field of Classification Search
CPC .................................................. G06K 9/0002
See application file for complete search history.

(56) References Cited

U.S. PATENT DOCUMENTS 9,607,203 B1* 3/2017 Yazdandoost ........ A61B 5/1172
2015/0187707 A1* 7/2015 Lee ....................... H01L 23/562
324/663

FOREIGN PATENT DOCUMENTS

WO WO-2017183879 A1 * 10/2017 ............... H04N 5/30

OTHER PUBLICATIONS

Z.W. Zhong, "Various Adhesives for Flip Chips", Journal of Electronic Packaging, Mar. 2005, vol. 127, cover sheet + pp. 29-32. (Year: 2005).*

* cited by examiner

*Primary Examiner* — Brian Werner
(74) *Attorney, Agent, or Firm* — Hodgson Russ LLP

(57) ABSTRACT

The present disclosure discloses an ultrasonic fingerprint sensor package. The ultrasonic fingerprint sensor package includes a substrate, a control chip, an ultrasonic probe, and packaging material. The substrate includes a substrate top surface and a plurality of first connection electrodes formed on the substrate top surface. The control chip includes a chip bottom surface and a plurality of second connection electrodes formed on the chip bottom surface. The control chip is connected to the substrate using a flip chip mounting technology. The second connection electrodes are connected to the first connection electrodes. The ultrasonic probe is arranged on the control chip, and configured to emit ultrasonic wave and receive ultrasonic wave reflected by an object. The packaging material covers the substrate and the control chip, and fixes the ultrasonic probe using a molding technology.

20 Claims, 2 Drawing Sheets

(51) Int. Cl.
*H01L 41/053* (2006.01)
*H01L 41/113* (2006.01)
*H01L 41/047* (2006.01)
*H01L 41/04* (2006.01)
*H01L 41/08* (2006.01)
*H01L 41/18* (2006.01)

(52) U.S. Cl.
CPC ...... *H01L 41/0533* (2013.01); *H01L 41/0825* (2013.01); *H01L 41/1132* (2013.01); *H01L 41/183* (2013.01)

ULTRASONIC FINGERPRINT SENSOR PACKAGE

CROSS-REFERENCE TO RELATED APPLICATION

This application claims priority to and benefits of Chinese Patent Application Serial No. CN 201610801757.X, filed with the State Intellectual Property Office of P. R. China on Sep. 5, 2016, and of Chinese Patent Application Serial No. CN 201621037945.1, filed with the State Intellectual Property Office of P. R. China on Sep. 5, 2016, the entire contents of which are incorporated herein by reference.

FIELD

The present disclosure relates to ultrasonic fingerprint sensor technologies, and particularly, to an ultrasonic fingerprint sensor package.

BACKGROUND

An ultrasonic fingerprint sensor package includes a substrate, a control chip, and an ultrasonic probe. The control chip is connected to the substrate, and cooperates with the substrate to control the ultrasonic probe. The control chip is connected to the substrate by a wire bonding process, which results a larger ultrasonic fingerprint sensor package.

SUMMARY

The present disclosure aims to solve at least one of the problems existing in the prior art to some extent at least. The present disclosure needs to provide an ultrasonic fingerprint sensor package.

The ultrasonic fingerprint sensor package of embodiments of the present disclosure includes a substrate, a control chip, an ultrasonic probe, and packaging material. The substrate includes a substrate top surface and a plurality of first connection electrodes formed on the substrate top surface. The control chip includes a chip bottom surface and a plurality of second connection electrodes formed on the chip bottom surface. The control chip is connected to the substrate using a flip chip mounting technology. The second connection electrodes are connected to the first connection electrodes. The ultrasonic probe is arranged on the control chip, and configured to emit ultrasonic wave and receive ultrasonic wave reflected by an object. The packaging material covers the substrate and the control chip, and fixes the ultrasonic probe using a molding technology.

In the ultrasonic fingerprint sensor package of the embodiment of the present disclosure, the control chip is connected to the substrate using the flip chip mounting technology, thereby reducing the size of the ultrasonic fingerprint sensor package.

In some embodiments, the ultrasonic fingerprint sensor package further includes a first adhesive layer, and the first adhesive layer connects the substrate top surface to the chip bottom surface.

In some embodiments, the first adhesive layer includes diallyl fumarate adhesive or liquid non-conductive adhesive.

In some embodiments, the positive projection of the control chip on the substrate top surface falls in the substrate top surface.

In some embodiments, the substrate and the control chip are substantially rectangular plates.

In some embodiments, the dimension of the control chip is less than that of the substrate, and the control chip is aligned with the center of the substrate.

In some embodiments, the substrate includes a substrate bottom surface, the substrate top surface and the substrate bottom surface are positioned at opposite sides of the substrate, wherein the substrate includes a plurality of third connection electrodes formed on the substrate bottom surface, wherein the substrate has pre-set circuits inside thereof, and wherein the pre-set circuits inside the substrate are connected to the first connection electrodes and the third connection electrodes in a pre-set manner to achieve a pre-set function.

In some embodiments, the third connection electrodes are land grid array (LGA) pads.

In some embodiments, the third connection electrodes are arranged inside the substrate.

In some embodiments, a sidewall of each third connection electrode, which is away from the substrate, is coplanar with the substrate bottom surface.

In some embodiments, the control chip includes a chip top surface and a plurality of fourth connection electrodes formed on the chip top surface, and the fourth connection electrodes are connected to part of the second connection electrodes by the through-silicon via (TSV) technology.

In some embodiments, the ultrasonic probe includes a piezoelectric layer, a plurality of emitters, and a plurality of receiving lines, wherein the piezoelectric layer includes an array of piezoelectric posts, the emitters are formed on a lower end of the piezoelectric layer and corresponds to the piezoelectric posts, wherein each of the emitters is connected to a corresponding piezoelectric post, wherein the receiving lines are arranged on an upper end of the piezoelectric layer and corresponds to the piezoelectric posts, and wherein each of the receiving lines is connected to a row of the piezoelectric posts.

In some embodiments, an isolation layer is arranged between the piezoelectric posts.

In some embodiments, the material of the isolation layer is epoxy resin.

In some embodiments, the emitters include an alloy layer on the lower end of the piezoelectric layer and a plurality of metal pads arranged on the lower end of the alloy layer.

In some embodiments, a probe connection electrode is arranged on each of the emitters, the control chip includes a chip top surface and fifth connection electrodes formed on the chip top surface, and the probe connection electrodes are connected to the fifth connection electrodes.

In some embodiments, the fifth connection electrodes are arranged inside the control chip, the control chip defines a plurality of holes corresponding to the fifth connection electrodes, and the probe connection electrodes are embedded in the holes.

In some embodiments, the ultrasonic probe is coupled to the control chip using a flip chip mounting technology.

In some embodiments, the ultrasonic probe includes a probe top surface away from the substrate, and the packaging material is coplanar with the probe top surface.

In some embodiments, the ultrasonic fingerprint sensor package includes a second adhesive layer, and the second adhesive layer adheres the ultrasonic probe to the control chip.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
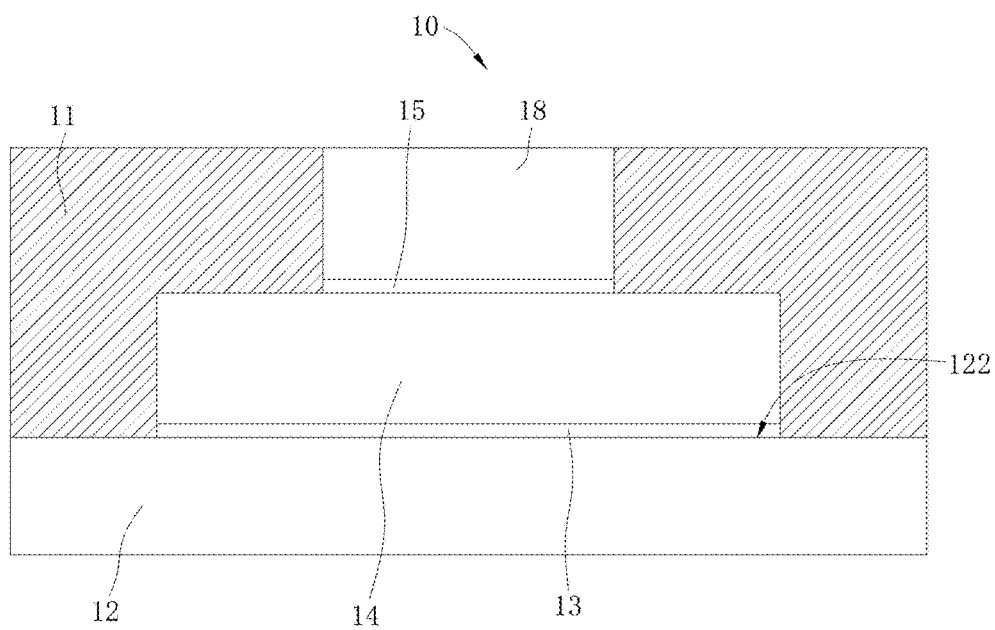
FIG. 1 is a cross-sectional view of an ultrasonic fingerprint sensor package, according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions.

The embodiments described herein with reference to the accompanying drawings are explanatory and illustrative, which are used to generally understand the present disclosure. The embodiments shall not be construed to limit the present disclosure.

Figure 2:
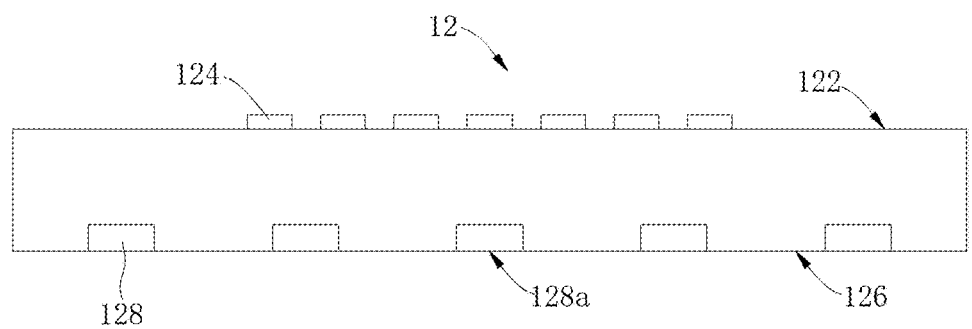
FIG. 2 is a cross-sectional view of a substrate of the ultrasonic fingerprint sensor package, according to an embodiment of the present disclosure.
Figure 3:
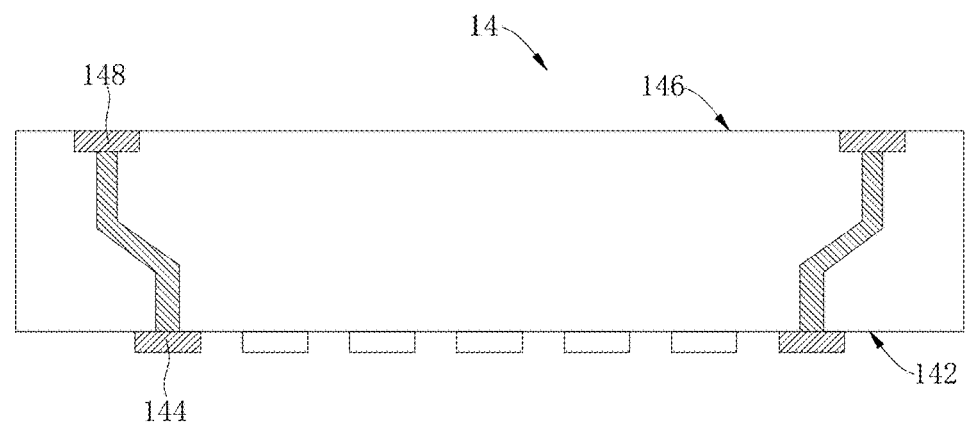
FIG. 3 is a cross-sectional view of a control chip of the ultrasonic fingerprint sensor package, according to an embodiment of the present disclosure.

Referring to FIGS. 1-3, an ultrasonic fingerprint sensor package 10, according to an embodiment of the present disclosure, includes a substrate 12, a control chip 14, an ultrasonic probe 18, and packaging material 11. The substrate 12 includes a substrate top surface 122 and a number of first connection electrodes 124 formed on the substrate top surface 122. The control chip 14 includes a chip bottom surface 142 and a number of second connection electrodes 144 formed on the chip bottom surface 142. The control chip 14 is arranged on the substrate 12. The control chip 14 is connected to the substrate 12 using a flip chip mounting technology, and the second connection electrodes 144 are connected to the first connection electrodes 124. The ultrasonic probe 18 is arranged on the control chip 14, and is configured to emit ultrasonic wave and receive ultrasonic wave reflected by an object. The packaging material 11 covers the substrate 12 and the control chip 14, and fixes the ultrasonic probe 18 using a molding technology.

In the ultrasonic fingerprint sensor package 10 of the embodiment of the present disclosure, the control chip 14 is connected to the substrate 12 using the flip chip mounting technology, thereby reducing the size of the ultrasonic fingerprint sensor package 10.

In some embodiments, the substrate 12 can be a printed circuit board or a semiconductor substrate, such as a silicon substrate.

In some embodiments, the control chip 14 includes a chip bottom surface 142 corresponding to the substrate top surface 122. The ultrasonic fingerprint sensor package 10 includes a first adhesive layer 13. The first adhesive layer 13 connects the substrate top surface 122 to the chip bottom surface 142.

That is, the control chip 14 is fixed on the substrate 12 by the first adhesive layer 13. The ultrasonic fingerprint sensor package 10 has a more simple structure, and is easily processed. Thus, the cost of the ultrasonic fingerprint sensor package 10 is further reduced. Meanwhile, the first adhesive layer 13 makes the connection between the control chip 14 and the substrate 12 occupy a small space. Thus, the ultrasonic fingerprint sensor package 10 can be reduced in size.

In some embodiments, the control chip 14 can be connected to the substrate 12 by the other ways, or the packaging material 11 makes the control chip 14 and the substrate 12 fit closely together.

In some embodiments, the first adhesive layer 13 can be diallyl fumarate adhesive or liquid non-conductive adhesive.

Thus, good adhesive performance of the first adhesive layer 13 makes the control chip 14 connect to the substrate 12 more tight. During mass production, the above-mentioned adhesive connection between the control chip 14 and the substrate 12 has a lower cost, and reduce the cost of the ultrasonic fingerprint sensor package 10.

In the other embodiments, the material of the first adhesive layer 13 is not limited to those of the above-described embodiments.

In some embodiments, the positive projection of the control chip 14 on the substrate top surface 122 falls in the substrate top surface 122.

Thus, the packaging material 11 can contact with the substrate top surface 122, thereby increasing the intensity of the packaging material 11.

In some embodiments, the substrate 12 and the control chip 14 are substantially rectangular plates. The dimension of the control chip 14 is less than that of the substrate 12. The control chip 14 is aligned with the center of the substrate 12, so the positive projection of the control chip 14 on the substrate top surface 122 falls in the substrate top surface 122.

Referring to FIG. 2, in some embodiments, the substrate 12 includes a substrate bottom surface 126. The substrate top surface 122 and the substrate bottom surface 126 are positioned at opposite sides of the substrate 12. The substrate 12 also includes third connection electrodes 128 formed on the substrate bottom surface 126. The substrate 12 has pre-set circuits inside thereof. The pre-set circuits inside the substrate 12 are connected to the first connection electrodes 124 and the third connection electrodes 128 in a pre-set manner to achieve a pre-set function.

The substrate 12 supplies connection points for an external circuit (not shown), so that the external circuit can be connected to the substrate 12 by the third connection electrodes 128. That is, the arrangement of the third connection electrodes 128 makes the ultrasonic fingerprint sensor package 10 connect to the external circuit.

In some embodiments, the third connection electrodes 128 are land grid array (LGA) pads. The first connection electrodes 124 and the second connection electrodes 144 are also pads.

Thus, Surface Mount Technology (SMT) can be used in the connection between the third connection electrodes 128 and the external circuit. The substrate 12 and the external circuit can be connected by contact points to avoid a welding method, thereby facilitating the mounting, disassembly, and replacement of the ultrasonic fingerprint sensor package 10.

In some embodiments, the third connection electrodes 128 are arranged inside the substrate 12. A sidewall 128a of each third connection electrode 128, which is away from the substrate 12, is coplanar with the substrate bottom surface 126.

It is understood that the location relationship between the third connection electrodes 128 and the substrate bottom surface 126 is not limited to those of the above-discussed embodiments.

Referring to FIG. 3, in some embodiments, the control chip 14 includes a chip top surface 146 and a number of fourth connection electrodes 148 formed on the chip top surface 146. The fourth connection electrodes 148 are connected to part of the second connection electrodes 144 by the through-silicon via (TSV) technology. The fourth connection electrodes 148 can connect the first connection electrodes 124 by the second connection electrodes 144 on the chip bottom surface 142, thereby avoiding the use of bonding wires and reducing the size of the control chip 14, and finally reducing the size of the ultrasonic fingerprint sensor package 10. Meanwhile, since the fourth connection electrodes 148 are connected to part of the second connection electrodes 144 by the through-silicon via (TSV) technology, the control chip 14 can be connected to the substrate 12 using the flip chip mounting technology. The fourth connection electrodes are also pads.

Figure 4:
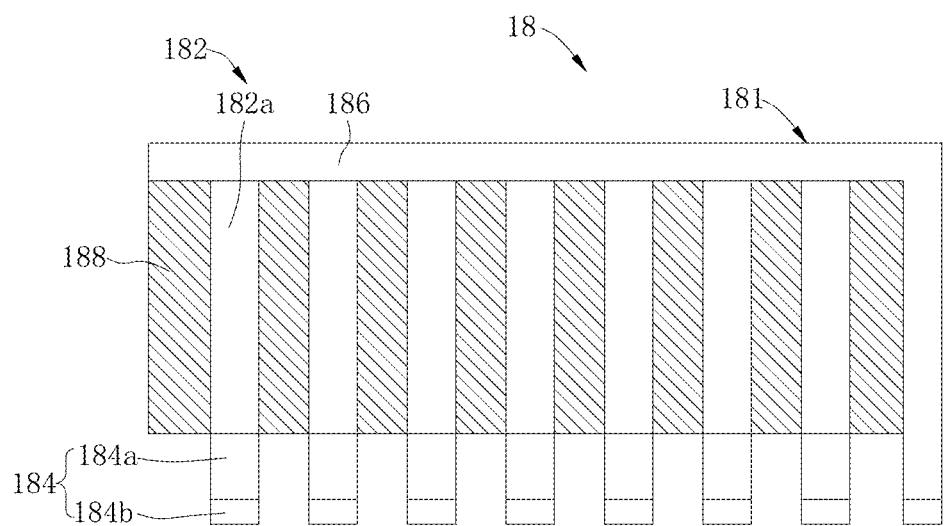
FIG. 4 is a cross-sectional view of an ultrasonic probe of the ultrasonic fingerprint sensor package, according to an embodiment of the present disclosure.
Figure 5:
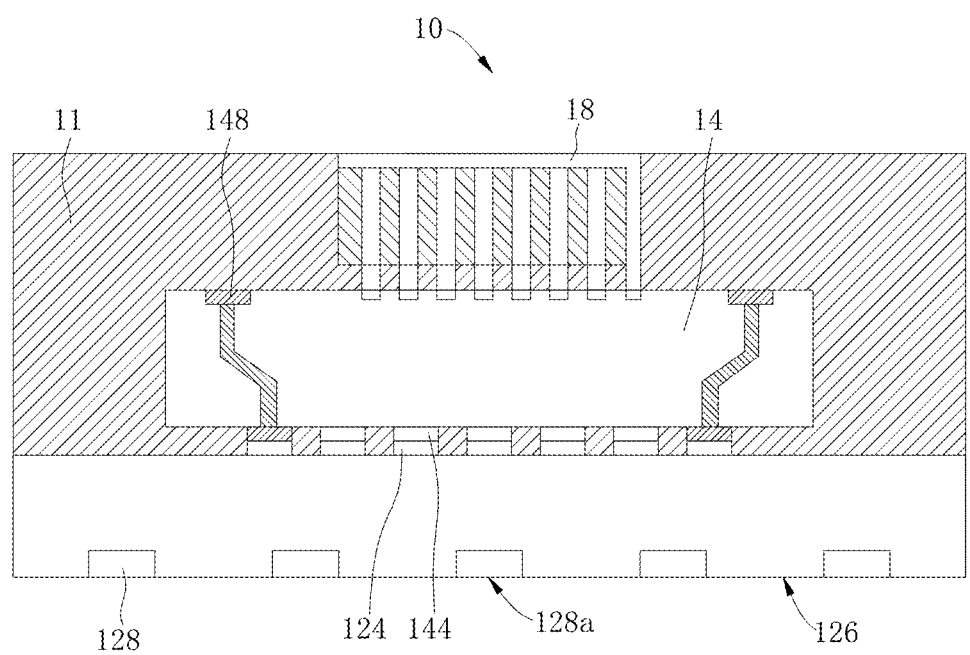
FIG. 5 is a cross-sectional view of an ultrasonic fingerprint sensor package, according to another embodiment of the present disclosure.

Referring to FIG. 4 and FIG. 5, in some embodiments, the ultrasonic probe 18 includes a piezoelectric layer 182, a number of emitters 184, and a number of receiving lines 186. The piezoelectric layer 182 includes an array of piezoelectric posts 182a. The emitters 184 are formed on a lower end of the piezoelectric layer 182, and correspond to the piezoelectric posts 182a. Each of the emitters 184 is connected to a corresponding piezoelectric post 182. The receiving lines 186 are arranged on an upper end of the piezoelectric layer 182, and correspond to the piezoelectric posts 182a. Each of the receiving lines 186 is connected to a row of the piezoelectric posts 182.

The emitter 184 can individually excite a certain piezoelectric post 182a instead of exciting a number of piezoelectric posts 182a which can produce a big lateral noise, thereby ensuring that the ultrasonic probe 18 can more accurately identify the fingerprint. At the same time, since the power of the point excitation is small, the energy consumption of the ultrasonic probe 18 is small. Moreover, the emitters 184 can be adhered to the control chip 14 by a point-to-point adhesion.

In some embodiments, an isolation layer 188 is arranged between the piezoelectric posts 182a. The material of the isolation layer 188 can be epoxy resin.

The gap between the piezoelectric posts 182 can be filled with the isolation layer 188, thereby preventing the piezoelectric posts 182a from affecting the ultrasonic wave transmission and reception, and further reducing the lateral noise.

In some embodiments, the emitters 184 form an alloy layer 184a. The material of the alloy layer 184a can include copper, nickel, silver, or the like. Thus, the emitters 184 can have a good electrical conductivity.

In some embodiments, the emitters 184 further includes a number of metal pads 184b arranged under the alloy layer 184a. That is, the entire ultrasonic probe 18 can be padded high by the metal pads 184b so that the emitters 184 can be easily connected to the control chip 14.

Referring to FIG. 3, in some embodiments, a probe connection electrode (not shown) is arranged on each of the emitters 184. The control chip 14 includes a chip top surface 146 and a number of fifth connection electrodes (not shown) formed on the chip top surface 146. The probe connection electrodes are connected to the fifth connection electrodes.

Thus, the ultrasonic probe 18 and the control chip 14 can fit closely together, thereby realizing the stable electrical connection.

Referring to FIG. 5, in some embodiments, the fifth connection electrodes are arranged inside the control chip 14. The control chip 14 defines a number of holes above and corresponding to the fifth connection electrodes. The probe connection electrodes are embedded in the holes. Thus, the probe connection electrodes can be easily connected to the fifth connection electrodes.

It is understood that, in the other embodiments, the location relationship between the fifth connection electrodes and the control chip 14 is not limited to those of the above-discussed embodiments.

In some embodiments, the control chip 14 has pre-set circuits inside thereof. The pre-set circuits inside the control chip 14 are connected to the second connection electrodes 144 and the fifth connection electrodes in a pre-set manner to achieve a pre-set function.

Thus, the control chip 14 supplies connection points for the ultrasonic probe 18, so that the ultrasonic probe 18 can be connected to the control chip 14 by the fifth connection electrodes.

In some embodiments, the control chip 14 can be an Application Specific Integrated Circuit (ASIC), and is configured to control the ultrasonic probe 18.

In some embodiments, the ultrasonic probe 18 is coupled to the control chip 14 using a flip chip mounting technology. Thus, the ultrasonic probe 18 can be tightly attached to the control chip 14. The connection between the control chip 14 and the ultrasonic probe 18 occupies a small space, and the ultrasonic fingerprint sensor package 10 can be reduced in size. Meanwhile, the electrical connection between the control chip 14 and the ultrasonic probe 18 has a higher stability.

Referring to FIG. 1, in some embodiments, the ultrasonic fingerprint sensor package 10 includes a second adhesive layer 15. The second adhesive layer 15 adheres the ultrasonic probe 18 to the control chip 14. Thus, the ultrasonic probe 18 can be tightly attached to and steadily fixed on the control chip 14.

In some embodiments, the material of the second adhesive layer 15 is the same as that of the first adhesive layer 13, thereby making the ultrasonic fingerprint sensor package 10 be easier packaged and reducing the adhesion cost of the ultrasonic fingerprint sensor package 10.

In some embodiments, the ultrasonic probe 18 includes a probe top surface 181 away from the substrate 12. The packaging material 11 is coplanar with the probe top surface 181. The packaging material 11 reduces the contact between the ultrasonic probe 18 and outside, thereby protecting the ultrasonic probe 18.

In some embodiments, the ultrasonic fingerprint sensor package 10 can be substantially a cube. The cube has a more compact structure. It is understood that the ultrasonic fingerprint sensor package 10 is not limited to be a cube, the ultrasonic fingerprint sensor package 10 can also be a cylinder, a triangular prism, and the like.

In some embodiments, the packing material 11 can be epoxy resin. Since the epoxy resin, on the surface of metal and non-metallic material, has excellent bonding strength, good dielectric property, small deformation shrinkage, good stability of the dimension, high hardness, good flexibility, and stability for alkali and most solvents, and the like characteristics, the packing material 11 working as a packing medium make the ultrasonic fingerprint sensor package 10 more stable.

In some embodiments, the packing material 11 can be other non-conductive material, or other non-piezoelectric material. It is understood that the packing material 11 is not limited to those of the above-discussed embodiments.

In this present disclosure, unless indicated otherwise, a structure in which a first feature is "on" or "underneath" a second feature may include an embodiment in which the first feature directly contacts the second feature and may include an embodiment in which an additional feature is prepared between the first feature and the second feature so that the first feature does not directly contact the second feature. Furthermore, a structure in which a first feature is "on" or "above" a second feature may include an embodiment in which the first feature is right above or inclined above the second feature and may include an embodiment in which the first feature is higher than the second feature. A structure in which a first feature is "under" or "below" a second feature may include an embodiment in which the first feature is right under or inclined under the second feature and may include an embodiment in which the first feature is lower than the second feature.

Reference throughout this specification to "an embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An ultrasonic fingerprint sensor package comprising:
   a substrate comprising a substrate top surface and a plurality of first connection electrodes formed on the substrate top surface;
   a control chip comprising a chip bottom surface and a plurality of second connection electrodes formed on the chip bottom surface, the control chip connected to the substrate using a flip chip mounting technology, and the second connection electrodes connected to the first connection electrodes;
   an ultrasonic probe arranged on the control chip, and configured to emit ultrasonic wave and receive ultrasonic wave reflected by an object; and
   packaging material covering the substrate and the control chip, and fixing the ultrasonic probe using a molding technology;
   wherein the control chip comprises a chip top surface and a plurality of fourth connection electrodes formed on the chip top surface, and the fourth connection electrodes is connected to part of the second connection electrodes by through-silicon via (TSV) technology.

2. The ultrasonic fingerprint sensor package of claim 1, wherein the ultrasonic fingerprint sensor package further comprises a first adhesive layer, and the first adhesive layer connects the substrate top surface to the chip bottom surface.

3. The ultrasonic fingerprint sensor package of claim 2, wherein the first adhesive layer comprises one or more of the following: diallyl fumarate adhesive and liquid non-conductive adhesive.

4. The ultrasonic fingerprint sensor package of claim 1, wherein the positive projection of the control chip on the substrate top surface falls in the substrate top surface.

5. The ultrasonic fingerprint sensor package of claim 1, wherein the substrate and the control chip are substantially rectangular plates.

6. The ultrasonic fingerprint sensor package of claim 1, wherein the dimension of the control chip is less than that of the substrate, and the control chip is aligned with the center of the substrate.

7. The ultrasonic fingerprint sensor package of claim 1, wherein the substrate comprises a substrate bottom surface, the substrate top surface and the substrate bottom surface are positioned at opposite sides of the substrate, the substrate comprises a plurality of third connection electrodes formed on the substrate bottom surface, the substrate has pre-set circuits inside thereof, the pre-set circuits inside the substrate are connected to the first connection electrodes and the third connection electrodes in a pre-set manner to achieve a pre-set function.

8. The ultrasonic fingerprint sensor package of claim 7, wherein the third connection electrodes are land grid array (LGA) pads.

9. The ultrasonic fingerprint sensor package of claim 7, wherein the third connection electrodes is arranged inside the substrate.

10. The ultrasonic fingerprint sensor package of claim 7, wherein a sidewall of each third connection electrode, which is away from the substrate, is coplanar with the substrate bottom surface.

11. An ultrasonic fingerprint sensor package comprising:
    a substrate comprising a substrate top surface and a plurality of first connection electrodes formed on the substrate top surface;
    a control chip comprising a chip bottom surface and a plurality of second connection electrodes formed on the chip bottom surface, the control chip connected to the substrate using a flip chip mounting technology, and the second connection electrodes connected to the first connection electrodes;
    an ultrasonic probe arranged on the control chip, and configured to emit ultrasonic wave and receive ultrasonic wave reflected by an object; and
    packaging material covering the substrate and the control chip, and fixing the ultrasonic probe using a molding technology;
    wherein the ultrasonic probe comprises a piezoelectric layer, a plurality of emitters, and a plurality of receiving lines, the piezoelectric layer comprises an array of piezoelectric posts, the emitters are formed on a lower end of the piezoelectric layer and corresponds to the piezoelectric posts, each of the emitters is connected to a corresponding piezoelectric post, the receiving lines are arranged on an upper end of the piezoelectric layer and corresponds to the piezoelectric posts, and each of the receiving lines is connected to a row of the piezoelectric posts.

12. The ultrasonic fingerprint sensor package of claim 11, wherein an isolation layer is arranged between the piezoelectric posts.

13. The ultrasonic fingerprint sensor package of claim 12, wherein the material of the isolation layer is epoxy resin.

14. The ultrasonic fingerprint sensor package of claim 11, wherein the emitters comprise an alloy layer on the lower end of the piezoelectric layer and a plurality of metal pads arranged on the lower end of the alloy layer.

15. The ultrasonic fingerprint sensor package of claim 11, wherein a probe connection electrode is arranged on each of the emitters, the control chip comprises a chip top surface and fifth connection electrodes formed on the chip top surface, and the probe connection electrodes are connected to the fifth connection electrodes.

16. The ultrasonic fingerprint sensor package of claim 15, wherein the fifth connection electrodes are arranged inside the control chip, the control chip defines a plurality of holes corresponding to the fifth connection electrodes, and the probe connection electrodes are embedded in the holes.

17. The ultrasonic fingerprint sensor package of claim 15, wherein the ultrasonic probe is coupled to the control chip using a flip chip mounting technology.

18. The ultrasonic fingerprint sensor package of claim 11, wherein the ultrasonic probe comprises a probe top surface away from the substrate, and the packaging material is coplanar with the probe top surface.

19. The ultrasonic fingerprint sensor package of claim 11, wherein the ultrasonic fingerprint sensor package comprises a second adhesive layer, and the second adhesive layer adheres the ultrasonic probe to the control chip.

20. The ultrasonic fingerprint sensor package of claim 1, wherein the ultrasonic probe comprises a piezoelectric layer, a plurality of emitters, and a plurality of receiving lines, the piezoelectric layer comprises an array of piezoelectric posts, the emitters are formed on a lower end of the piezoelectric layer and corresponds to the piezoelectric posts, each of the emitters is connected to a corresponding piezoelectric post, the receiving lines are arranged on an upper end of the piezoelectric layer and corresponds to the piezoelectric posts, and each of the receiving lines is connected to a row of the piezoelectric posts.

* * * * *